(12) United States Patent
Murao et al.

(10) Patent No.: US 7,887,723 B2
(45) Date of Patent: Feb. 15, 2011

(54) SITE-SELECTIVELY MODIFIED MICRO-AND NANOSTRUCTURES AND THE METHODS OF THEIR FABRICATION

(75) Inventors: Kenji Murao, Hitachi (JP); Kosuke Kuwabara, Hitachi (JP); Masahiko Ogino, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 296 days.

(21) Appl. No.: 11/623,817

(22) Filed: Jan. 17, 2007

(65) Prior Publication Data

US 2007/0190786 A1    Aug. 16, 2007

(30) Foreign Application Priority Data

Feb. 15, 2006    (JP) .............................. 2006-037362

(51) Int. Cl.
*B29C 65/00*    (2006.01)
(52) U.S. Cl. ........................ 264/41; 264/236; 264/293
(58) Field of Classification Search .................. 216/41, 216/44; 438/700, 702; 430/323
See application file for complete search history.

(56) References Cited

U.S. PATENT DOCUMENTS

| | | | | |
|---|---|---|---|---|
| 2003/0015698 A1* | 1/2003 | Baldo et al. | ................... | 257/40 |
| 2004/0200268 A1* | 10/2004 | Drahm et al. | ............... | 73/54.41 |
| 2006/0065136 A1* | 3/2006 | Takahashi et al. | ............ | 101/3.1 |
| 2006/0183060 A1* | 8/2006 | Perret et al. | ................. | 430/323 |
| 2006/0258163 A1* | 11/2006 | Ohashi et al. | ................ | 438/735 |
| 2007/0090574 A1* | 4/2007 | Terasaki et al. | ............. | 264/496 |
| 2007/0105356 A1* | 5/2007 | Wu et al. | ..................... | 438/584 |

FOREIGN PATENT DOCUMENTS

| | | |
|---|---|---|
| JP | 2004-259306 | 9/2004 |
| JP | 2005-297545 | 10/2005 |

OTHER PUBLICATIONS

Journal of Vacuum Science and Technology, B14 4129 (1996).
Japanese office action of Application No. 2006/037362 dated Aug. 17, 2010 with English translation.

* cited by examiner

*Primary Examiner*—Duy-Vu N Deo
(74) *Attorney, Agent, or Firm*—Antonelli, Terry, Stout & Kraus, LLP.

(57) ABSTRACT

It is an object of the present invention to provide a method which can easily and selectively modify specific sites on indentations or protrusions of indentation/protrusion structures fabricated by nano-imprinting. Pressing a mold having indentation/protrusion structures onto a polymer substrate comprising at least two layers of different chemical composition exposes the second layer, which has been covered by the outermost layer, in pillars formed as a result of the pressing. Site-specific chemical modification of the pillars can be achieved by formulating a desired chemical composition for the second layer beforehand, or by chemical modification of the exposed second layer cross-sections in the pillars.

6 Claims, 2 Drawing Sheets

(a)

(b)

SITE-SELECTIVELY MODIFIED MICRO- AND NANOSTRUCTURES AND THE METHODS OF THEIR FABRICATION

FIELD OF THE INVENTION

The present invention relates to micro- and nanostructures of layered structure with indentations and protrusions, in particular that having a site-selectively modified structure formed by selective chemical or physical modification, provided as required on specific sites on the cross-sections of the layered structure; method of fabrication thereof; and an electronic device, optical device and testing apparatus for materials derived from living bodies, produced by the method.

BACKGROUND OF THE INVENTION

Photolithography and electron beam lithography are known as methods for fabricating fine structures of several tens to several hundreds of nanometers, and have been applied to produce various semiconductor devices. Photolithography involves time-consuming steps for exposing a resist film surface to patterns of interconnections after they are contracted, and for developing them. Electron beam lithography directly draws images by electron beams, and hence takes much time to draw them on a number of substrates. For these reasons, the conventional lithography is difficult to realize a high through-put. On the other hand, nano-imprinting is proposed, e.g., by Non-patent Document 1, as a method for fabricating micro- or nano-structure at a high through-put. This method prepares a mold comprising an Si or metallic substrate on which a desired indentation/protrusion pattern is drawn, and presses the mold against a polymer film heated above its glass transition temperature to transfer the pattern image onto the film, which carries the reversed image. The compounds for the polymer film include thermoplastic ones, e.g., polymethyl methacrylate (PMMA), polycarbonate, polystyrene and cross-linked compound thereof; and thermosetting ones, e.g., polyimide. The nanoimprinting can produce structures with polymer pillars having a diameter of several tens to hundreds of nanometers, and those characterized by their cavity or groove structures. The substrate thus processed can possibly exhibit physically interesting characteristics, e.g., optical characteristics, and, at the same time, can find interesting applications as a substrate for supporting biomaterials, e.g., living body cells, proteins and DNAs.

(Non-patent Document 1) Journal of Vacuum Science and Technology, B14, 4129 (1996)

BRIEF SUMMARY OF THE INVENTION

It is very important to realize a method for imparting new characteristics to a substrate prepared by the nanoimprinting by chemical or physical modification or treatment carried out selectively on specific sites on the pillars or indentations formed on the substrate, in order to further expand the applicable areas for the nanoimprinting method. One of the important areas to which the nanoimprinting method is applicable is production of photonic crystals by utilizing its characteristic of easily fabricating fine, repeated structures. When a method is developed to chemically or physically modify the repeated structure on periodically selected specific sites, it can give a photonic band having a fine structure and modulate it to adjust the structure to a specific purpose.

Another advantage of selective modification by a chemical or physical treatment of selected areas on the nanoimprinted substrate is that a biomaterial can be retained on specific repeated sites on the substrate, e.g., on arranged pillars. As a result, the biomaterial is repeatedly arranged while being spaced from each other at given intervals, and can be individually provided with a function. This procedure can be applied to screening effective pharmacological effects over a wide range and in a short time by acting various drugs on the biomaterial.

In addition, when a biomaterial can be retained at stereospecific sites on a nanoimprinted substrate by the site-specific modification, access of an external chemical or physical stimulus, e.g., transfers of electrical charges or ions, or light irradiation, can be also stereospecific to the material. The nanoimprinting is also applicable to the investigations of the stereoscopic effects. The stereospecific biomaterial can be retained in various sites, e.g., in grooves or cavities in the nanoimprinted substrate.

However, both indentation and protrusion structures formed based on a polymer material by the conventional nanoimprinting transfer described above have the same chemical surfaces, because they are made of the same material, with the result that it is difficult to further site-selectively modify or process the structure.

It is an object of the present invention to provide a method which can easily and selectively modify specific sites on indentations or protrusions of the indentation/protrusion structure fabricated by nanoimprinting. It is another object to provide a micro- or nanostructure with indentations or protrusions physically or chemically modified selectively on specific sites.

The inventors of the present invention have extensively studied processes for pressing a polymer film with a mold having indentations and protrusions to transfer them onto the film, and developed a novel method of site-selective modifications of the processed structure on the substrate onto which the indentation/protrusion pattern is transferred by a chemical or physical procedure.

The present invention provides a method of producing a micro- and nano-structure, comprising the steps of:

pressing a mold into a substrate, wherein the mold has indentation/protrusion structures on a surface of the mold and the substrate has a layered structure with at least two layers, to deform said at least two layers of the substrate to transfer the indentation/protrusion structures onto a surface of the substrate; and releasing the mold from the substrate to expose cross-sections of the second layer or below from the outermost surface of the substrate onto indentation/protrusion structures transferred.

Additionally, the present invention provides the above-mentioned method, wherein the outermost layer of the substrate and the layer exposed through pressing the mold have different chemical or physical properties from each other. It is possible to impart a chemically or physically different property selectively to one or more specific layers which constitute the substrate by coating them beforehand with a layer of different chemical or physical property, or by a chemical treatment of the exposed layer cross-sections. When the exposed layer cross-sections are chemically treated, it is preferable, to contain a material having a catalytic function or chemical substituents chemically reactive with specific materials in the layer to be treated. The structure can be multi-functional, when the layers are subjected to individually different chemical treatments, instead of treating a specific layer alone.

The present invention also provides a micro- and nano-structure indentation/protrusion structures on a surface of a substrate, wherein the protrusions or indentations have at least two layer structure, cross-sections of which are exposed to the outside, and the uppermost layer of the layered structure and at least one layer below the uppermost layer have different chemical or physical properties from each other.

Other objects, features and advantages of the invention will become apparent from the following description of the embodiments of the invention taken in conjunction with the accompanying drawings.

DESCRIPTION OF REFERENCE NUMERALS

Figure 1:
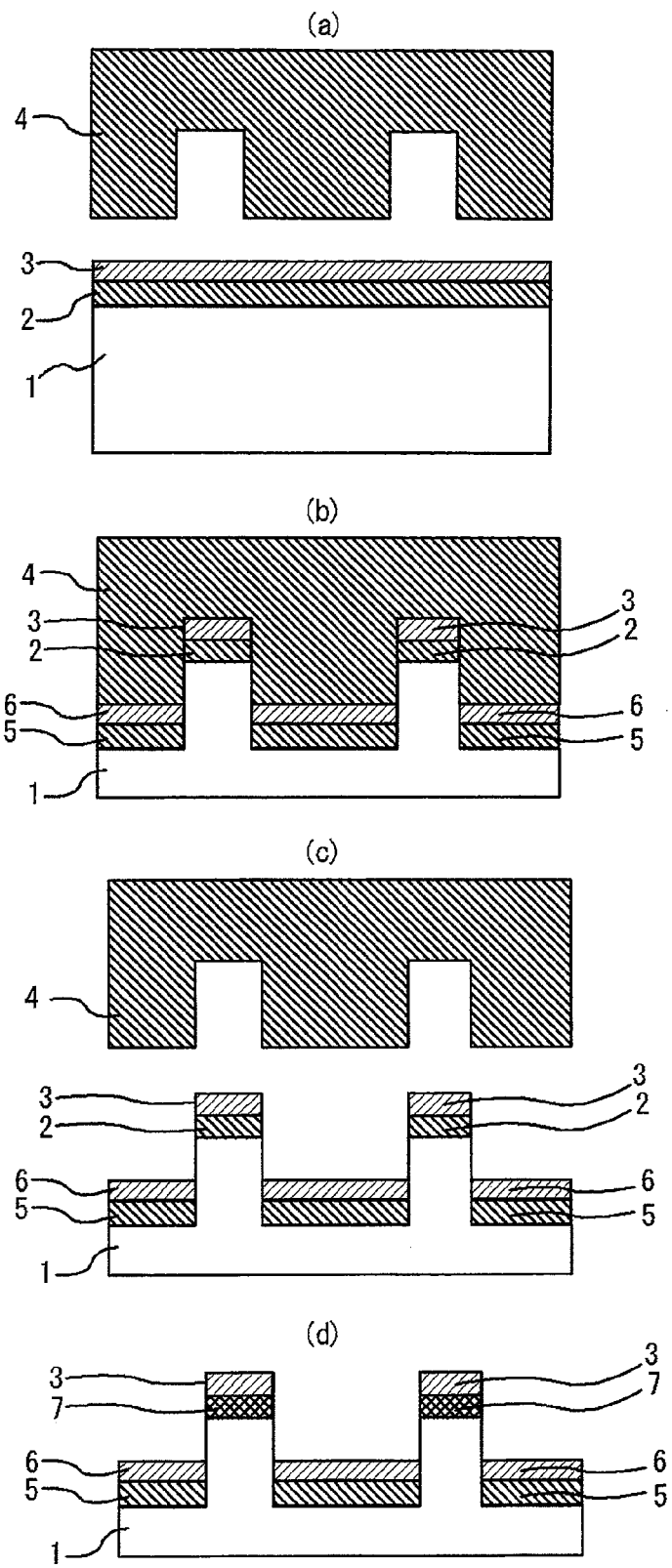
FIG. 1 outlines one embodiment of the process of the present invention for fabricating a layered structure, onto which an indentation/protrusion pattern is transferred.

1: Polymer substrate, 2: Pillared intermediate polymer layer, 3: Pillared outermost polymer layer, 4: Mold, 5: Original polymer intermediate layer pressed by the mold protrusions, 6: Original outermost polymer layer pressed by the mold protrusions, 7: Nickel-plated intermediate polymer layer pillar, 8: Original intermediate polymer layer pressed by the mold protrusions, 9: Original outermost polymer layer pressed by the mold protrusions, 10: Intermediate polymer layer in the pillar, 11: Outermost polymer layer in the pillar, 12: Intermediate polymer layer in the pillar, to which crown ether molecules are bound via ester bondings.

DETAILED DESCRIPTION OF THE INVENTION

The method of the present invention for fabrication of a micro- or nano-structure comprises at least two steps; the first step for pressing a mold having an indentation/protrusion pattern against a polymer substrate of layered structure with at least two layers of different material, to transfer the pattern onto the substrate, and the subsequent second step for chemically or physically treating the cross-sections of the second layer from the outermost surface of the substrate as one of the layers exposed as a result of having the indentation/protrusion structure. For a substrate of two-layered structure, the cross-sections appear in the steps on the polymer substrate pressed by the mold protrusions. When the above-described pillars are formed on the polymer substrate by the pattern transfer, the second layer exposed in cross-sections of the pillar portion in addition to the uppermost portion, and the portions being kept flat upon pressing by the mold have the surface unchanged from the initial state. On the other hand, when grooves or cavities are formed by the pattern transfer on a polymer substrate with layered structure, the second layer cross-sections are exposed in the grooves or cavities. The exposed cross-sections of the second layer correspond to the indentation/protrusion patterns on the mold, and chemical or physical modifications can fabricate the chemical or physical structures as intended by the original designs. As a result, the chemical process automatically induces the site-specific chemical derivatization (modification).

The first layer not only serves as the uppermost layer of the cross-sections but also constitutes the flat portion of surface, and therefore can be hardly site-specific through modifications targeted against the first layer.

A point to be kept in mind about the first step is that fluidization of the polymeric materials in the polymer film occurs to some extent at the sites against which the protrusions on the mold are pressed, since the nano-imprinting transfer is generally carried out at temperatures above or near its glass transition point. Therefore, there may be cases where the indentations or protrusions on the polymer film have substantially the same composition, even when the film has a layered structure with at least two layers based on different materials, onto which the indentation/protrusion pattern is transferred as a result of fluidization of the polymer layer, by which is meant in this case that the second layer may be difficult to have the exposed cross-sections. The inventors of the present invention have found an effective procedure for effectively exposing the cross-sections even in the above case.

The material which constitutes the second layer is provided with a chemical or physical properties different from those of the material for the first layer before it is treated in the second step. More specifically, it is very effective to incorporate a material having a catalytic function in the polymer material which constitutes the second layer. One example is to dope the polymer compound with a palladium salt or the like which can accelerate electroless plating. The palladium ions can be reduced to deposit the metal selectively on the exposed cross-sections of the second layer by electroless plating. It is also effective to incorporate the layer chemically treated with an iron salt or the like as a precursor for a catalyst being effective for depositions of nanowires or nanodots.

Another procedure for selective chemical modification of part of the all cross-sections, e.g., the second layer alone, is binding beforehand a highly chemically reactive substituents to the polymer material which constitutes the second layer. For example, an amine group incorporated in the polymer material for the second layer can easily give the amide bond when reacted with an acid chloride reagent after it appears on the cross-sections. When a biomaterial is bound beforehand to an acid chloride group, the specific pillar sites can be selectively modified with the biomaterial through the covalent bonding through the above-described reaction. Thus, biomaterial or fragments thereof can be bound, as required, via the chemical substituent. Similarly, luminescent materials can also be bound via the chemical substituent.

When a polymer substrate of layered structure has a desired chemical environment at the cross-sections exposed as a result of being pressed by a mold having an indentation/protrusion pattern, the above-described chemical modification can be naturally saved. For example, a polymer substrate with a layered structure containing a hydrophilic and hydrophobic layers falls into this case.

Keeping the first layer less chemically active than the second layer is also important to make the chemical activity of the second layer stand out.

The chemical reactions for the chemical modification for the present invention is preferably mild to an extent not thermally or chemically harmful to the materials which constitute the layers. There are many appropriate chemical reactions for such modifications, including those producing esters,

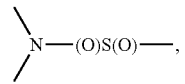

Schiff bases and the like, in addition to the above-described amide formation. A reaction which produces simple ion pairs can be also useful for the chemical modification for the present invention.

Moreover, when a compound capable of working as a ligand for a metallic ion is incorporated in the second layer, either directly bound or doped, a specific portion of the exposed cross-sections can be modified selectively to have a structure by the metal ions only by soaking in a solution containing the metal ions.

A film, although of an originally single layer, can meet the requirements of the present invention, when a specific material is incorporated selectively at the surface of the film, and has a concentration gradient of a material across the film thickness.

The object of the present invention should not be limited to those surface structures as pillars, holes, and line/space and so forth. The indentation or protrusion preferably has a width or diameter of 10 nm to 500 μm and height or depth of 50 nm to 5000 μm. The size may be adequately selected for specific purposes.

Polymeric materials for the layer onto which the indentations/protrusions are transferred in the present invention include, but not limited to, thermoplastic resins, e.g., polycycloolefin, polymethyl methacrylate, polystyrene, polycarbonate, polyethylene terephthalate (PET), polylactic acid, polypropylene, polyethylene, polyvinyl alcohol, ABS resin, AS resin, polyamides, polyacetals, polybutylene terephthalate, glass-reinforced polyethylene terephthalate, modified polyphenylene ether, polyvinyl chloride, polyphenylene sulfide, polyetheretherketone, liquid-crystal polymer, fluororesins, polyarete, polysulfone, polyether sulfone, polyamideimide, polyetherimide and thermoplastic polyimide; and thermosetting resins, e.g., phenolic resin, melamine resin, urea resin, epoxy resin, unsaturated polyester resin, silicone resin, diallylphthalate resin, polyamidebismaleimide and polybisamide triazole.

The present invention has been described by taking, as an example, a starting substrate of two-layered structure. When the starting substrate comprises three or more layers, on the other hand, the sites to be modified can be spatially more confined by modifying the second layer. When the first layer is thinner relative to the fabricated indentation/protrusion height/depth, the second layer is positioned closer to the outermost layer. When the second layer to be chemically modified is also significantly thinner relative to the fabricated height/depth, its position will be relatively limited to the upper portion of the pillar, if the pillars are provided. The ratio of the outermost layer/second layer thickness is preferably in a range from 1/30 to 30/1, and that of the second layer/third layer in a range from 1/100 to 100/1 in consideration of strength of the structure and easiness of exposing the cross-sections of the layers below the outermost layer, among others.

For the multi-layered structure with three or more layers, each layer below the uppermost layer can cause specific chemical modifications, by the employment of specific precursors or substituents for each layer, respectively. This procedure yields a structure with multilayers chemically modified differently.

As discussed above, while a mold having indentations/protrusions on the surface is pressed against a polymer substrate of layered structure, fluidization of a polymer layer which constitutes the outermost layer may occur, making it difficult to expose cross-sections of the second and subsequent layer(s) in the fabricated steps. Some of the effective measures against these troubles are use of a material easily sheared stresses during the transfer step, or use of a material fluidized to a lesser extent, for the polymer layer which constitutes the outermost layer. A polymer material sheared easily can be found relatively from polymer compounds having a relatively rigid monomer unit. On the other hand, a polymer material with limited fluidity can be easily produced by cross-linking a linear polymer compound. The cross-linking can easily proceeds by, e.g., acting a formaldehyde or its polymer derivative on a polymer compound having hydroxyl group. More specifically, the cross-linked product can be produced by acting poly(vinyl phenol) on a polymer intermediate produced by the reaction between melamine and formaldehyde.

The inventors of the present invention have developed still another procedure to cope with cases where exposure of the cross-sections is difficult. The conventional transfer step is carried out at a temperature higher than glass transition point of the layer concerned. By contrast, the transfer can also be carried out at relatively lower temperatures in the present invention. In particular, it is carried out at a temperature substantially below glass transition point of each of the outermost and second layers. Fluidization of the polymer chain is suppressed under these conditions to help expose the cross-sections. It should be noted, however, that the polymer layer may be greatly strained upon the transfer process, and that it may be cracked around the greatly deformed sites, unless these strains are sufficiently relaxed. These strains can be relaxed by keeping the substrate at a temperature higher than glass transition point for a given time or longer. More specifically, the transfer carried out at a relatively low temperature is followed by heat treatment of the polymer substrate while it is kept pressed by the mold, to keep them at a temperature higher than glass transition point of the second polymer layer, and then leaving them to cool. This produces the polymer substrate with the exposed cross-sections, when the mold is released from the substrate.

Examples of the physical modification described above include changing substrate chemical composition to change hydrophilicity or hydrophobicity of the polymer layer cross-sections. Here, a chemical process is again employed to change its physical properties. The material basis which causes a physical property change is given by chemical modification in many cases. Therefore, it is generally difficult to completely distinguish chemical and physical modifications from each other.

In the method of the present invention, represented by chemical modification of the substrate second layer in pillars, the second layer, subject to chemical modifications the uppermost layer, if the first layer is removed. This situation is advantageous for chemical modifications and subsequent depositions of functional compounds. For a substrate having pillars at a high density, the first layer as the uppermost layer can be selectively removed relatively easily. A flat adhesive film, when pressed against the substrate of nano-imprinted structure, can take off the pillar uppermost layer, because it comes into contact selectively with the layer to be peeled off.

One of the major characteristics of the present invention is that it can fabricate the above structure without involving time-consuming steps, e.g., ion irradiation for etching, which reduce through-puts and raise costs.

The embodiments of the present invention are described by referring to the attached drawings.

Embodiment 1

FIG. 1 represents a flow diagram illustrating the steps of Embodiment 1 of the present invention. FIG. 1(a) shows a polymer substrate of layered structure, comprising a polymer substrate 1 composed of Polymer A as the major component, intermediate layer 2 composed of Polymer B as the major component and outermost layer 3 composed of Polymer Compound C as the major component, in this order. The intermediate layer 2 is doped beforehand with palladium ions in the form of salt. A mold 4 to pressed into the substrate has an indentation/protrusion pattern on the surface. FIG. 1(b) illustrates the mold 4 pressing into the substrate of layered structure from the top. FIG. 1(c) illustrates the mold released from the polymer substrate 1, leaving the polymer substrate onto which the indentation/protrusion pattern is transferred from the mold 4 to form protruded pillars on the substrate. As illustrated, the intermediate 2 cross-sections are exposed in the upper portions of the pillars as cross-section upper portions and not exposed in the other portions of the substrate. The whole body of the polymer substrate is soaked in an aqueous reducing solution, to reduce the palladium salt contained in the exposed intermediate layer 2 cross-sections. Next, the whole body of the polymer substrate is dipped in an electroless nickel plating solution to deposit metallic nickel selectively on the intermediate layer 2 cross-sections in the presence of palladium as a catalyst. FIG. 1(d) illustrates the substrate plated with nickel selectively on the intermediate layer 7 cross-sections, or the exposed intermediate layer 2 cross-sections.

Heating the polymer substrate before it is pressed into by the mold will help leave little strains in the pillared structure and cause no deterioration of its mechanical strength. The polymer substrate 1, intermediate layer 2 and outermost layer 3 are generally composed of polymeric materials with different glass transition. Therefore, it is recommended to be based on the glass transition point of the polymer substrate 1 as a reference for heat treatment temperature. However, it is not an absolute reference, because the layers are strained differently depending on the polymer compounds used. Moreover, as discussed earlier, when the layer cross-sections is easily got in a transferring procedure, it is effective to carry out the transfer process intentionally at a temperature substantially lower than glass transition points of any polymer compound used. In such a case, however, it is an effective procedure to sufficiently anneal the pattern-transferred structure with the mold kept pressed down into at a temperature raised above the glass transition point, in order to releave possible strain in the structure.

Embodiment 2

Figure 2:
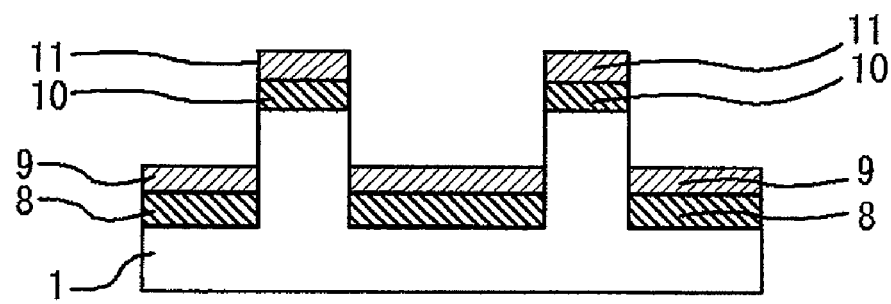
FIG. 2 outlines another embodiment of the process of present invention for site-selective surface modification of the layered structure, onto which an indentation/protrusion pattern is transferred.
Figure 2:
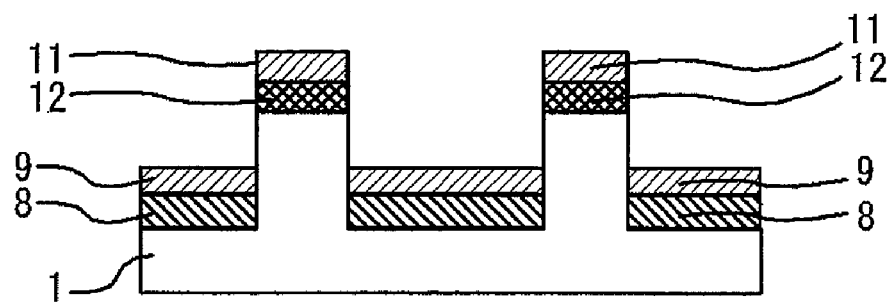

A polymer substrate of three-layered structure comprising a polymer substrate 1, intermediate layer 8 and outermost layer 9 is pressed by a mold having an indentation/protrusion pattern to form pillars in a manner similar to that for Embodiment 1, leading to the formation of exposed intermediate layer 10 with uppermost layer 11 in the upper portions of the pillars, as illustrated in FIG. 2(a). The polymer materials comprising layers 8 and outermost layer 10 contain a polymer compound having a hydroxyl group bound to the carbon atom in a monomer unit out of monomers units on the average. The polymer substrate illustrated in FIG. 2(a) is dipped in a solution containing a crown ether compound with an acid chloride terminal group, stirred, washed and then dried. Thus, the pattern-transferred structure having the intermediate layer 12 with the covalently attached crown ether moieties thereto via the ester bond formation selectively on the intermediate layer 10 surface on the upper pillar portions. This structure captures a metallic ions at the crown ether sites present only in the intermediate layer 12 on the upper pillar portions.

The present invention is described below in more detail by Examples.

Example 1

A 200 μm thick polymer film (Topas 8007F04, Ticona) was cut into a 15 mm by 15 mm piece, and the resulting piece of polymer film was coated with a 25.0 g/L of poly(4-vinyl phenol) (molecular weight: about 20,000, Aldrich) 2-propanol solution to form the 230 nm thick poly(4-vinyl phenol) film thereon by spin coating at 3000 rpm. It was placed on a hot plate kept at 70° C. to thoroughly evaporate the solvent. Next, a 25.0 g/L solution of polymethyl methacrylate (PMMA, molecular weight: about 15,000) was spread on the coated polymer film to form the 270 nm thick PMMA film thereon by spinning at 4000 rpm. The resultant laminated polymer film was placed on a hot plate kept at 70° C. to thoroughly evaporate the solvent. It was then placed on a stainless steel substrate kept at 80° C. in a vacuum chamber, and pressed down into with a silicon substrate (6 by 10 mm) having an indentation/protrusion patterns (depth: 1 μm and diameter: 5 μm) on the surface at a load of 120 kgf/cm$^2$ for 60 seconds. It was cooled to room temperature and withdrawn from the chamber. The polymer laminate film was released from the silicon mold, to observe the resulting pillar surfaces with a scanning electron microscope. This scanning electron microscopic observations were carried out after the pillars are partly eroded by a solvent vapor. It was confirmed that the 1 μm thick pillar had the two polymer layers to a depth of about 0.5 μm from the top.

Example 2

First, 5.1 mg of tetrakis(acetonitrile) palladium (II) was added to a 2 mL solution of poly(4-vinyl phenol) in 2-propanol (25.0 g/L), and the resultant mixture was then stirred for about 1 hour for dissolution, to give a brown solution. This solution was filtered by a filter having 200 nm-pores. The solution was spread dropwise on a 180 μm thick polyethylene terephthalate polymer film (20 by 20 mm) to form the film thereon by spin coating carried out at 2000 rpm. The resulting polymer film was dried on a hot plate kept at 80° C. for 5 minutes. Next, polystyrene (molecular weight: about 13,000) was dissolved in toluene to prepare the 30 g/L solution, which was spread dropwise on the polymer film and then spin-coated at 4000 rpm. It was then pressed with a silicon substrate having an indentation/protrusion pattern (depth: 1 μm and diameter: 1 μm) on the surface at 82° C. for 20 seconds in a vacuum chamber, to transfer the pattern onto the polymer film. It was withdrawn from the chamber. The polymer film was released from the silicon substrate, to be subjected to scanning electron microscopic. As a result, observations was confirmed that an about 250 nm wide band was formed around the pillar center, making the upper and lower portions distinguishable from each other.

Example 3

A 55 g/L 2-propanol solution of poly(vinyl alcohol-co-vinyl acetate-co-itaconic acid) was spread dropwise on a 188 μm thick polyethylene terephthalate polymer film sheet (35 by 35 mm) and then spin coated at 4000 rpm. The resulting polymer film was dried on a hot plate kept at 70° C. for 30 minutes. Next, a 25 g/L polycarbonate (molecular weight: about 20,000) solution was spread dropwise on the polymer film and then spin coated at 2000 rpm. The resulting polymer laminate film was dried on a hot plate kept at 70° C. for 30 minutes. It was then pressed by a silicon substrate having an indentation/protrusion pattern (depth: 2 µm and diameter: 5 µm) on the surface at 90° C. and a load of 120 kgf/cm$^2$ for 30 seconds in a vacuum chamber. The pattern-transferred structure was observed by a scanning electron microscope, after it was partly eroded by 2-propanol. It was confirmed that the pillars had a three-layered structure.

It should be further understood by those skilled in the art that although the foregoing description has been made on embodiments of the invention, the invention is not limited thereto and various changes and modifications may be made without departing from the spirit of the invention and the scope of the appended claims.

ADVANTAGES OF THE INVENTION

A mold with indentation/protrusion structures is pressed into a polymer substrate having a layered structure to transfer the indentation/protrusion patterns onto the substrate. This procedure exposes a polymer layer, which is originally covered by the outermost layer, as cross-sections of thus obtained indentation/protrusion patterns of the substrate. This allows chemical modification to be applied to specific sites, e.g., exposed upper part of the pillars or groove cross-sections formed through the pressing process with mold, to produce a site-selectively structure chemically modified on specific sites. The site-specific chemical modification by the present invention can realize photonic crystals with fine structures, a formation of fine metallic interconnections and a configuration of a specific chemical substituent.

The invention claimed is:

1. A method for producing a micro- or nano-structure, comprising the steps of:

pressing a mold onto a substrate from an outermost surface of the substrate, wherein the mold has indentation/protrusion structures on a surface of the mold and the substrate is composed of a polymer material having a composition changing in a depth direction, to press the protrusion structure of the mold into a portion of the polymer material having a composition different than that of the outermost surface of the substrate at a temperature lower than a glass transition point of the polymer and transfer the indentation/protrusion structures to the substrate from the outermost surface into the portion of the polymer material different than that of the outermost surface of the substrate; and releasing the mold from the substrate to form pillars of the polymer material, exposed faces of the pillars having a composition different from that of the outermost surface.

2. The method of claim 1, wherein the indentation/protrusion structures comprise micro-indentation/protrusion structures.

3. The method of claim 1, wherein the indentation/protrusion structures comprise nano-indentation/protrusion structures.

4. The method of claim 1, further comprising the step of heating the substrate at a temperature higher than glass transition point of the polymer, while keeping the mold pressed after pressing the protrusion structure of the mold into a portion of the polymer material having a composition different than that of the outermost surface of the substrate.

5. The method of claim 1, wherein both a bottom face of the indentation structure and a top surface of the protrusion structure of the substrate having the indentation/protrusion structures transferred are composed of an identical composition.

6. The method of claim 1, wherein cross-sections having a composition different from that of the bottom face of the indentation structure and the top surface of the protrusion structure are exposed onto a side face of the protrusion structure transferred.

* * * * *